United States Patent
Beha

[11] Patent Number: 5,859,530
[45] Date of Patent: Jan. 12, 1999

[54] PROCESS FOR DETERMINING THE PHASE SEQUENCE IN A THREE-PHASE NETWORK (ROTARY CURRENT NETWORK)

[75] Inventor: Christian Beha, Glottertal, Germany

[73] Assignee: Ch. Beha GmbH Technische Neuentwicklungen, Germany

[21] Appl. No.: 719,944

[22] Filed: Sep. 25, 1996

[30] Foreign Application Priority Data

Aug. 7, 1996 [DE] Germany .................. 196 31 807.6

[51] Int. Cl.$^6$ .................................................. G01R 25/00
[52] U.S. Cl. ........................... 324/86; 361/76; 361/77; 340/658
[58] Field of Search .................. 361/76, 77; 324/86, 324/658

[56] References Cited

U.S. PATENT DOCUMENTS

| 4,278,937 | 7/1981 | Immler | 324/86 |
| 4,710,703 | 12/1987 | Harkiewicz | 324/86 |
| 4,901,005 | 2/1990 | Shin | 324/86 |

FOREIGN PATENT DOCUMENTS

| 31 17 284 | 11/1982 | Germany . |
| 40 02 603 | 8/1991 | Germany . |
| 92 06 307.1 | 9/1992 | Germany . |
| 52-6571 | 1/1977 | Japan . |

OTHER PUBLICATIONS

Elektrotechnik und Kerntechnik Grundlagen, p. 87, Oct. 1971.

Primary Examiner—Josie Ballato
Assistant Examiner—Jose M. Solis
Attorney, Agent, or Firm—Gary M. Nath; Nath & Associates

[57] ABSTRACT

In a first measurement step, the two test probes of a measurement apparatus are contacted with two of the three phase lines. The measurement apparatus determines the frequency of the three-phase voltage. In a subsequent second measurement step, one of the two test probes is brought into connection with the remaining third phase line. The other test probe is held in contact with the other line. In the second measurement step the voltage level or voltage profile on the third phase line is evaluated inside the measurement apparatus in comparison to the first phase line during one or more time windows of length $\pi$.

8 Claims, 2 Drawing Sheets

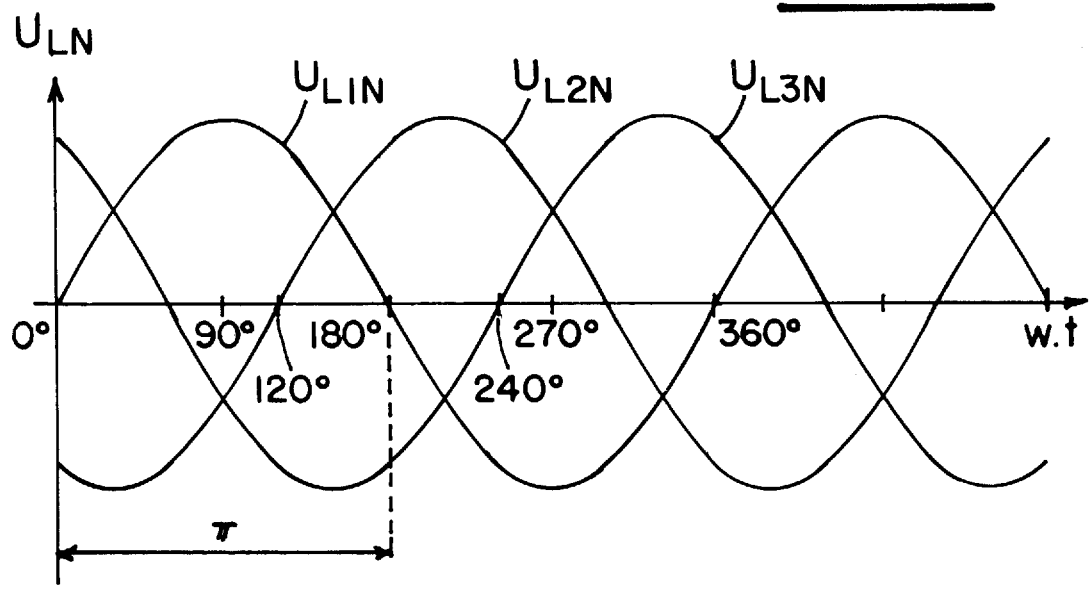
FIG. 1.1
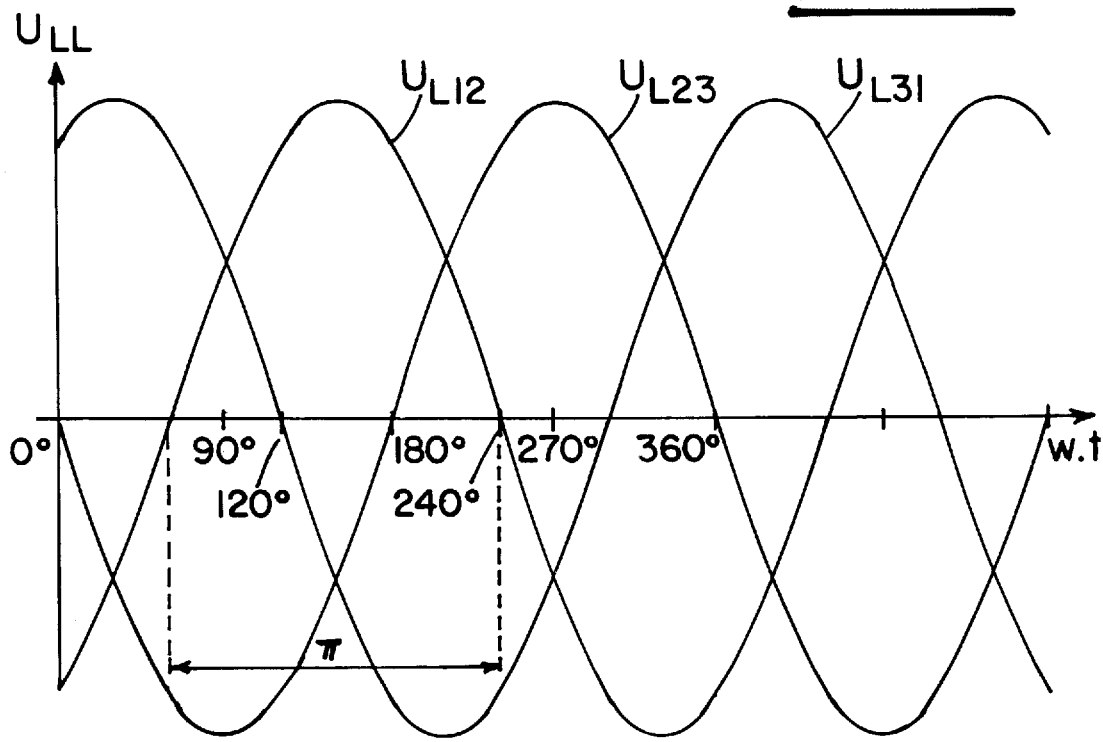
FIG. 1.2

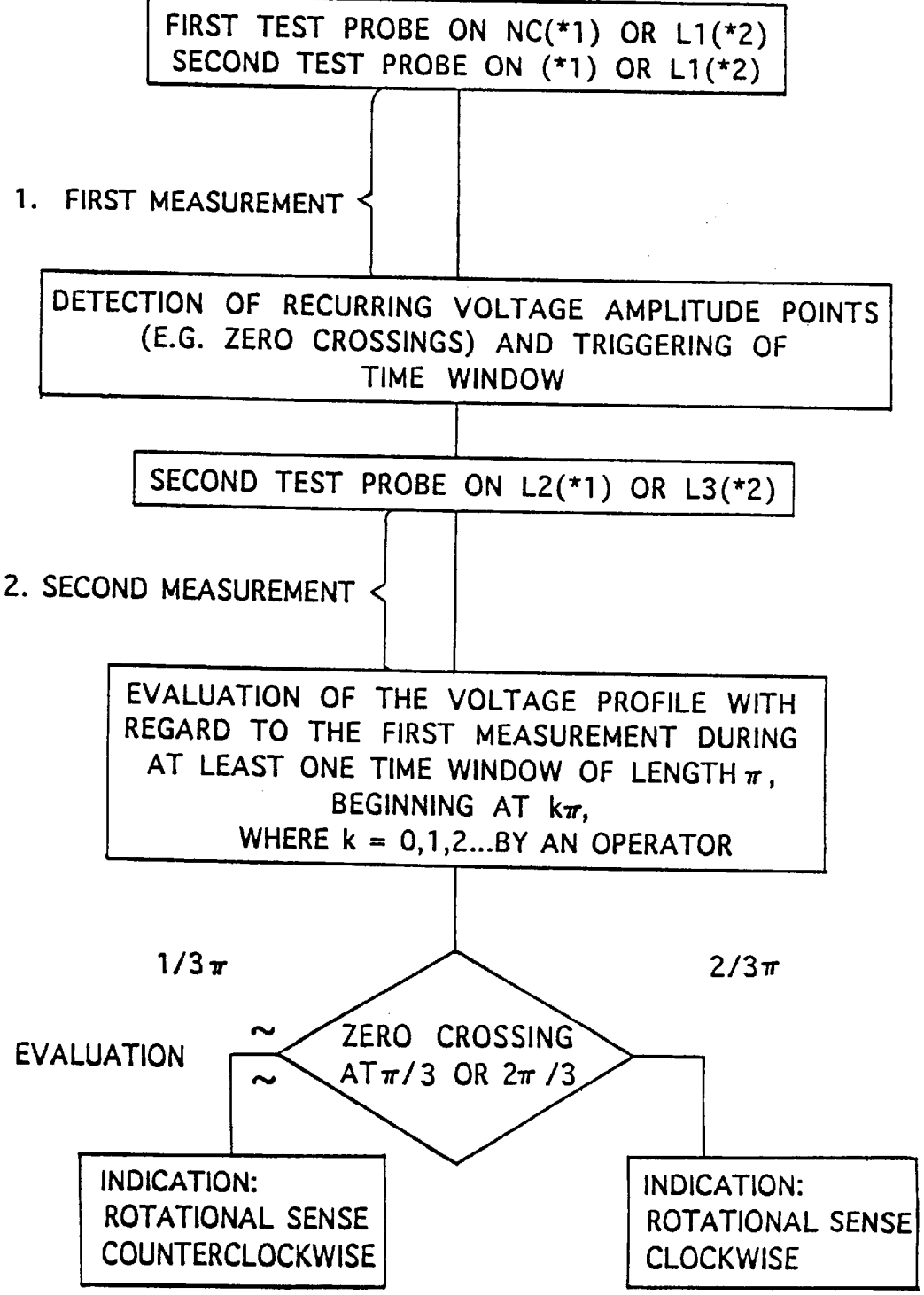

PROCESS FOR DETERMINING THE PHASE SEQUENCE IN A THREE-PHASE NETWORK (ROTARY CURRENT NETWORK)

The invention pertains to a process-for determining the phase sequence in a three-phase network, in which the phase relationship of the voltage profiles on the three-phase lines of the three-phase network are compared and evaluated.

By now, a wide variety of phase sequence indicators using various processes for determining the phase sequence in a three-phase network have become known. The phase sequence indicators are employed in particular in the installation of three-phase motors and three-phase pumps, since in those cases the phase sequence of the power supply network must be known if the system is to function properly. The determination of the phase sequence is also important for the proper recognition of the individual lines in a switchbox into which a three-phase power line leads, but where the individual conductors are unknown in terms of their phases.

So-called induction instruments, in which an aluminum disk is seated free to rotate over three coils connected to the three phases R, S and T of the three-phase network, were previously employed to determine the phase sequence. When the three-phase current flows, a moving field is produced which flows past the aluminum disk, creates eddy currents in it and causes it to rotate in the same direction. The direction of rotation and hence the succession of phases can be viewed directly from the rotational sense of the aluminum disk (cf., for example, the rororo-Technik-Lexikon, Vol. 4, p. 87).

Determining the rotational sense of a three-phase network with test probes present in a measurement apparatus and a separate ground contact is known from the introduction to the description in DE 4,002,603 A1. With this measurement apparatus, the sum of the voltage of two phases with reference to ground is measured, with one of the voltages being measured while phase-shifted. The problematic aspect of this measurement apparatus is the mandatory ground contact that is needed.

DE 4,002,603 A1 also describes a solution with such a separate ground contact. This solution provides a voltage tester with two test probes and a so-called diverting vane arranged in a handgrip and connected to a reference potential. The diverting vane runs parallel to the handgrip of one of the test probes and acts during measurement operation in conjunction with the person's hand surrounding the handgrip as a capacitor with reference to ground. The diverting vane and the two test probes are connected to the measurement electronics. The measurement electronics have an LCD indicator connected in series with the diverting vane and indicating the direction of the rotating field.

A similar unit is described in DE-U9,206,307. In place of the diverting vane, a contact to be touched by an operator is provided in the handgrip of the measurement apparatus.

A problematic aspect of the aforementioned measurement apparatuses with a diverting vane or a touch contact is that the handgrip of the measurement unit must be firmly gripped by the hand, or the touch contact must be securely touched. If this is not done, an erroneous measurement can occur or, under certain circumstances, no measurement result at all will be obtained. This is particularly problematic when the operator is wearing gloves. In this case a reliable determination of the phase sequence is no longer possible at all. It is also problematic if the connection line between the test probes is too long and furthermore wound around the operator during the measurement process. A phase sequence indication is then no longer possible, because of excessively weak capacitive currents.

An additional circuit arrangement for monitoring a symmetrical three-phase electric current is known from DE 3,117,284 A1. For each phase of the three-phase system, the circuit arrangement described there provides a zero-crossing detector which generates a pulse upon a zero crossing of the three-phase voltages each time such a zero crossing occurs. These pulses are fed to a phase sequence monitoring circuit, which determines if, between two zero-crossing signals that are associated with successive phases, a zero-crossing signal of the third phase occurs. If this is a case, then there is an error in the sequence of the phases and this is displayed. In detail, the zero crossings of the individual phases are ascertained, and these signals are fed to a logic unit that emits an error signal at its output. The error signal indicates whether a phase error is present. The determination of the phase sequence in the three-phase network is not possible with the circuit arrangement of this document, since there it is merely examined whether there is a zero point of the third phase voltage between the two zero-crossing points of the other two phases.

The present invention is therefore based on the problem of specifying a process for measuring the phase sequence in a three-phase network which permits an assured determination of the phase sequence and which can also be safely operated with gloves.

This problem is solved in the process mentioned initially by the following process steps:

contacting a first phase line with a first test probe and a second phase line with a second test probe of a measurement unit;

acquiring recurring voltage amplitude points of the voltage present between the two test probes and starting a time window generator at one of these voltage amplitude points, with time windows being generated according to the spacing of the recurring voltage amplitude points;

removing the first or second test probe from the previously contacted phase line and contacting this test probe with the third phase line;

determining inside one or more of the time windows prescribed by the time window generator whether the phase position of the voltage on that phase line which is contacted during both the first and the third steps is leading or lagging; and activating a display unit for a clockwise rotating field if the phase voltage on the third line lags and a display for a counterclockwise rotating field if the phase voltage leads.

The measurement apparatus necessary for the process according to the invention consists essentially of a unit with two test probes and an internal electronics section. The electronics section has a microcomputer, or a digital or analog PLL circuit, one or more counter units, one or more comparators, as well as an internal voltage meter circuit.

In order to determine the phase sequence in a three-phase network, the test probes of the measurement apparatus must initially [be brought into] contact with two of the three conductors by an operator. Subsequently, one of these two test probes is brought into contact with the remaining third conductor. The other test probe here must continue to be held in contact with the previously contacted phase line.

The measurement apparatus then operates as follows, with the assumption, for instance, that the operator initially contacts conductors L1 and L2 in the first measurement stage and then contacts conductors L1 and L3 with the test probes in a second measurement stage.

With the first measurement step, in which the first test probe is in contact with phase line L1 and the second with phase line L2, a measurement of the frequency or period of the three-phase voltages is acquired internally in the electronics unit of the measurement apparatus. This frequency or period is identical for all three-phase voltages within the three-phase network. Acquiring recurring voltage amplitude points, such as zero crossings, maxima or minima from the voltage present at the two test probes and starting a time window generator as function thereof is provided according to the invention. The time window generator is started at the appearance of one of these voltage amplitude points and generates time windows corresponding to the interval between successive recurring voltage amplitude points. According to the invention, the time window generator continues to operate even if one of the two test probes is removed from the first or second phase line after the first measurement step.

After the second test probe has subsequently been contacted with the third phase line L3, the voltage level or voltage profile on the third phase line L3 is evaluated internally in the electronics of the measurement apparatus in comparison to the first phase line L1 during one or more time windows determined by the time window generator. It is practical for the time windows to have a length k·π and to begin with a zero crossing of the phase voltage on the phase line that was contacted from the beginning to the end of the measurement process by one of the test probes. As a function of the detected voltage level/profile it can then be determined inside this time window whether the phase sequence is clockwise or counterclockwise. Inside the time window, for instance, it can be determined whether the voltage maximum or any zero crossing that occurs on the third phase line is evaluated as a measure for the phase sequence.

In order to obtain better measurement precision, several time windows can be monitored in sequence, within which the voltage profile of the phase voltage on the third phase line is evaluated.

BRIEF DESCRIPTIONS OF THE DRAWINGS

The process according to the invention is further explained below in conjunction with two figures. These show:

FIGS. 1, (1.1/1.2) isa voltage diagram with the phase voltages $U_{L1N}, U_{L2N}, U_{L3N}$ of a symmetrical three-phase alternating current network, as well as a voltage diagram with the line-to-line voltages $U_{L12}, U_{L23}, U_{L31}$;

FIG. 2 is a sequence diagram of the process according to the invention.

In FIG. 1.1, the three phase voltages $U_{L1N}, U_{L2N}, U_{L3N}$ of a symmetrical three-phase alternating current network with a sinusoidal profile of the individual phase voltages are illustrated by way of example. In the present embodiment, the phase angle is 120°=2π/3. The phase voltage $U_{LN}$ on the three-phase conductors L1,L2,L3 is 230 V in this typical three-phase network, while the line-to-line voltage $U_{LL}$ between two phase conductors is 380 V as FIG. 1.2 illustrates. The three line-to-line voltages $U_{L12}, U_{L23}, U_{L31}$ are illustrated in FIG. 1.2.

The phase voltages and line-to-line voltages are plotted for the time period Ω×t.

When installing switchboxes or the like, it is strictly necessary to determine the phase sequence of the three-phase network. The electrician involved with this therefore faces the problem of determining the phase sequence on the three-phase lines such that an unambiguous clockwise or counterclockwise rotational sense is obtained.

According to the process of the present invention, this is done, as can be seen from the sequence diagram of FIG. 2, in that initially the first test probe of the measurement unit is contacted with the first line and then the second test probe is contacted with the second line. Here the measurement apparatus determines a measurement for the frequency or period of the three-phase voltage and, based on this frequency or period, starts a time window generator. It is assumed in FIG. 2 that, for instance, the zero crossings of the voltages between the two test probes are detected. After detecting these zero crossings, the aforesaid time window generator is started with time windows that precisely match the intervals between the detected zero crossings. In this case, each time window starts precisely at the point at which a zero crossing occurs or would occur, depending on whether the test probes are still in contact with the phase lines. Once started at the correct time, the time window generator thus continues functioning even if one of the test probes is removed from the line.

Subsequently, the first or second test probe is contacted with the third line. An additional measurement process takes place inside the measurement apparatus, in which the nature of the voltage profile during one or more of the aforesaid time windows of length π is evaluated. The time window starts, as mentioned above, at a zero crossing of the phase voltage on that phase line which is continuously connected to the test probe. The measurement unit then determines where the zero crossing of the most recently contacted phase line lies. If this zero crossing is at π/3, then an indication of a counterclockwise rotating field is displayed in the measurement unit. If the zero crossing is as 2π/3, then the display activates a signal for a clockwise rotating field. It is assumed here that the three-phase network to be tested is a three-phase network as illustrated in FIG. 1.

Three concrete measurement example are described below, with the continued assumption that the three-phase network to be tested is a three-phase network as illustrated in FIG. 1. It is additionally assumed that on the as-yet-unknown phase line L1 the phase voltage $U_{L1N}$ is present, on the as-yet-unknown phase line L2 the phase voltage $U_{L2N}$ is present, and on the as-yet-unknown phase line L3 the phase voltage $U_{L3N}$ is present.

First Example

Initially the first test probe touches the as-yet-unknown phase line L2 and the second test probe the as-yet-unknown phase line L1. Subsequently, the as-yet-unknown phase line L3 is touched by the second test probe.

Inside the recurring time windows π of the phase voltage on L2 the zero crossing of the phase voltage on L3 always appears at a distance of π/3 from the time window starting point [sic; endpoint], and thus past the center of the time window. The phase voltage on L3 thus lags the phase voltage on L2 by 120°. The rotational sense of the phase voltage on L3 with respect to the phase voltage on L2 is therefore clockwise.

Second Example

Initially the first test probe touches the as-yet-unknown phase line L1 and the second test probe the as-yet-unknown phase line L3. Subsequently, the as-yet-unknown phase line L2 is touched by the second test probe.

Inside the recurring time windows π of the phase voltage on L1 the zero crossing of the phase voltage on L2 always appears at a distance of π/3 from the time window starting point, and thus past the center of the time window. The phase voltage on L2 thus lags the phase voltage on L1 by 120°. The rotational sense of the phase voltage on L2 with respect to the phase voltage on L1 is therefore once again clockwise.

Third Example

Initially the first test probe touches the as-yet-unknown phase line L1 and the second test probe the as-yet-unknown phase line L2. Subsequently, the as-yet-unknown phase line L3 is touched by the second test probe.

Inside the recurring time windows n of the phase voltage on L1 the zero crossing of the phase voltage on L3 always appears at a distance of $\pi/3$ from the time window-starting point, and thus before the center of the time window. The phase voltage on L3 thus leads the phase voltage on L1 by 120°. The rotational sense is therefore counterclockwise.

Instead of determining the time of the zero crossings easily the voltage maximum occurring on the phase line L3 inside the respective time windows can just as easily be determined. If this is in the back end of the time window, i.e., at $\pi/3$ [sic; $2\pi/3$], then the rotational direction is counterclockwise. If the voltage maximum is in the beginning of the time window, i.e., at $\pi/3$, the rotational sense is clockwise.

In the aforementioned examples, the so-called external conductor method was described, that is to say, the measurement of the voltages between the individual phase conductors L1,L2,L3. This method can be readily applied, however, to measurements between an external conductor and a neutral conductor.

I claim:

1. Process for determining the phase sequence in a three-phase network, in which the phase relationship of the voltage profiles on the three-phase lines of the three-phase network are compared and evaluated, characterized by the following process steps:

contacting a first phase line with a first test probe and a second phase line with a second test probe of a measurement unit;

acquiring recurring voltage amplitude points of the voltage present between the two test probes and starting a time window generator at one of these voltage amplitude points, with time windows being generated according to the spacing of the recurring voltage amplitude points;

removing the first or second test probe from the previously-contacted phase line and contacting this test probe with the third phase line;

determining inside one or more of the time windows prescribed by the time window generator whether the phase position of the voltage on that phase line which is contacted during both the first and the third steps leads or lags; and activating a display unit for a clockwise rotating field if the phase voltage on the third line lags and a display for a counterclockwise rotating field if the phase voltage leads.

2. Process according to claim 1, characterized in that the time window has a length of $\pi$ and is started at $k \times \pi$ of that phase voltage, with the phase line of which the one test probe is contacted, with k=0,1,2, . . . .

3. Process according to claim 1, characterized in that the zero crossings of the phase voltages are determined and evaluated.

4. Process according to claim 3, characterized in that, between two successive zero crossings of the phase voltage on the first phase line, the zero crossing of the phase voltage on the third phase line is determined and that the indication for a clockwise rotating field is activated if the zero crossing of the phase voltage on the third phase line is closer to the first zero crossing of the phase voltage of the first phase line, and that the indication for a counterclockwise rotating filed is activated if the zero crossing of the phase voltage on the third phase line is closer to the second zero crossing of the phase voltage of the first phase line.

5. Process according to claim 4, characterized in that a chronometric unit is started at the first zero crossing and that, at the zero crossing of the phase voltage of the third phase line, this chronometric unit is stopped and the elapsed time is used as a measurement for the rotational sense.

6. Process according to claim 1, characterized in that between two zero crossings of the phase voltage on that phase line which is always contacted by the test probe, the maximum of the phase voltage on the third phase line is determined and is used as a measurement for a clockwise or counterclockwise rotating filed.

7. Process according to claim 1, characterized in that the frequency of the three-phase network is determined on the basis of the recurring zero crossings of at least one of the phase voltages.

8. The process as claimed in claim 1, wherein each of said phase voltages is measured without reference to ground.

* * * * *